United States Patent
Ueda

(10) Patent No.: US 7,800,948 B2
(45) Date of Patent: Sep. 21, 2010

(54) NONVOLATILE SEMICONDUCTOR MEMORY DEVICE

(75) Inventor: Naoki Ueda, Nara (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 199 days.

(21) Appl. No.: 12/092,497

(22) PCT Filed: Nov. 1, 2006

(86) PCT No.: PCT/JP2006/321818
§ 371 (c)(1),
(2), (4) Date: Oct. 14, 2008

(87) PCT Pub. No.: WO2007/052684
PCT Pub. Date: May 10, 2007

(65) Prior Publication Data
US 2009/0268525 A1   Oct. 29, 2009

(30) Foreign Application Priority Data
Nov. 2, 2005   (JP)   ................. 2005-319074

(51) Int. Cl.
*G11C 16/04*   (2006.01)
(52) U.S. Cl. .................. 365/185.18; 365/185.14; 365/185.15; 365/185.26
(58) Field of Classification Search ............ 365/185.18, 365/185.14, 185.15, 185.26
See application file for complete search history.

(56) References Cited

U.S. PATENT DOCUMENTS

| 5,027,321 | A | 6/1991 | Park |
| 5,204,835 | A | 4/1993 | Eitan |
| 5,621,690 | A * | 4/1997 | Jungroth et al. ............. 365/200 |
| 5,780,890 | A | 7/1998 | Hazama |
| 6,587,375 | B2 * | 7/2003 | Chung et al. ........... 365/185.13 |
| 6,894,913 | B2 | 5/2005 | Yamauchi |
| 2010/0046291 | A1 * | 2/2010 | Dudeck et al. ......... 365/185.05 |

FOREIGN PATENT DOCUMENTS

JP   3-176895 A   7/1991

(Continued)

OTHER PUBLICATIONS

Mukherjee, S. et al. (1985). "A Single Transistor EEPROM Cell And Its Implementation In A 512K CMOS EEPROM," *IEDM Technical Digest*, vol. 26.1; pp. 616-619.

*Primary Examiner*—Pho M Luu
(74) *Attorney, Agent, or Firm*—Morrison & Foerster LLP

(57) ABSTRACT

A nonvolatile semiconductor memory device capable of preventing the disturb phenomenon that could become a serious problem as the nonvolatile memory having a virtual grounding bit line is miniaturized includes a program row voltage application circuit for applying a predetermined program row voltage to the selected word line in programming in the selected memory cell, a program column voltage application circuit for applying a ground voltage to one of a pair of selected bit lines and applying a predetermined program column voltage to the other of the selected bit lines in programming; and a counter voltage application circuit for applying a counter voltage of an intermediate voltage between the ground voltage and program column voltage, to an adjacent unselected bit line not connected to the selected memory cell in the first and second bit lines and adjacent to the selected bit line to which the program column voltage is applied.

11 Claims, 9 Drawing Sheets

FOREIGN PATENT DOCUMENTS

| | | |
|---|---|---|
| JP | 4-230079 | 8/1992 |
| JP | 8-236650 | 9/1996 |
| JP | 2000-514946 A | 11/2000 |
| JP | 2003-187584 A | 7/2003 |
| WO | WO-98/03977 | 1/1998 |

* cited by examiner

NONVOLATILE SEMICONDUCTOR MEMORY DEVICE

CROSS-REFERENCE TO RELATED APPLICATIONS

This application is a National Phase filing under 35 U.S.C. §371 of International Application No. PCT/JP2006/321818 filed on Nov. 1, 2006, and which claims priority to Japanese Patent Application No. 2005-319074 filed on Nov. 2, 2005.

TECHNICAL FIELD

The present invention relates to a nonvolatile semiconductor memory device and more particularly, to a nonvolatile semiconductor memory device having a virtual ground line type memory cell array constitution for preventing erroneous programming (program disturb) by optimizing a bias method in a programming action.

BACKGROUND ART

A conventional nonvolatile semiconductor memory device includes an electrically erasable and programmable nonvolatile memory (flash EEPROM) including a memory cell array in which memory cells each having an electrically insulated floating gate are arranged in row and column directions in the form of a matrix (refer to non-patent document 1, for example). In addition, the conventional nonvolatile semiconductor memory device includes a nonvolatile memory having a virtual ground line type memory cell array constitution (refer to patent documents 1 to 3, for example). Here, FIG. 3 is a sectional view showing a virtual ground line type memory cell array including a memory cell having a floating gate structure, viewed from a direction perpendicular to a bit line.

As shown in FIG. 3, according to this memory cell array, memory cells 2 and 3 including a tunnel insulation film 8, floating gates 4 and 5 and an insulation film 9 are formed on a first conductivity type semiconductor substrate 7. The gates of the two adjacent memory cells 2 and 3 are connected to the same word line 1. A diffusion region 6b is provided in a self-aligned manner on the semiconductor substrate 7 below an interval part A between the floating gate 4 of the memory cell 2 and the floating gate 5 of the memory cell 3. In addition, diffusion regions 6a to 6d formed between the floating gates function as bit lines connected to the drain and source of each memory cell. Thus, since it is not necessary to provide a contact to connect the source and drain of the memory cell to a metal wiring, at the interval A with respect to each memory cell, the dimension of the interval part 6 can be reduced.

The floating gate 4 is electrically insulated by the insulation film from the terminals such as the control gate, source, drain and channel positioned around the floating gate 4, and the potential of the floating gate 4 is controlled by capacity coupling from these terminals. According to a data programming action, similar to a programming principle of a UV erase type EPROM, an electron is injected into the floating gate 4 by applying energy enough for exceeding a barrier height of the tunnel insulation film 8 serving as the insulation film, to the electron based on a hot carrier phenomenon as a mechanism. According to an erasing action, the electron is discharged through the tunnel oxide film 8 of the overlapped region of the floating gate 4 and the semiconductor substrate 7 based on a Fowler-Nordheim tunnel phenomenon as a mechanism. Thus, the number of the electrons in the floating gate 4 is adjusted. A reading action is performed, similar to a NOR type memory including a normal MOS transistor, by sensing a difference in accumulated data (electron number) of a drive current of the memory cell selected by the bit line 6b and the word line 1.

The programming action of the memory cell 3 by the hot carrier phenomenon is performed by applying a program row voltage $V_{WP}$ to the word line 1 serving as the control gate of the memory cell 3, applying a program column voltage $V_{BP}$ to the bit line diffusion region 6b serving as the drain of the memory cell 3, and applying a ground voltage to the bit line diffusion region 6a serving as the source of the memory cell 3. Thus, a channel hot electron induced by a channel current of the floating gate 5 of the memory cell 3 is generated in the vicinity of the end part of the diffusion region 6b under the floating gate 5, and injected in the floating gate 5 by an electric field generated by the program row voltage $V_{WP}$ applied to the word line 1 serving as the control gate. At this time, since the bit line diffusion regions 6b and 6c are fixed to the same potential, a channel current enough for injecting a hot electron to vary the threshold voltage of the memory cell 2 does not flow in the floating gate 4 of the unselected memory cell 2. Thus, the threshold voltage of the memory cell 2 is not varied.

FIG. 2 is a circuit diagram showing the array constitution of the virtual ground line type memory cell array. The memory cell array includes word lines $WL_i$ (i=0, ..., k, k+1, ...) connected to a row decoder and bit lines $BL_j$ (j=0, ..., m, ..., n) connected to a column decoder, in which the control gates of the memory cells belonging to the same row are connected to the same word line, the sources and drains of the memory cells belonging to the same column are connected to one adjacent pair of bit lines, and the bit line is shared by the two adjacent memory cells in the row direction. According to the example shown in FIG. 2, the memory cell array is divided into a plurality of blocks in the row direction every n bit lines, and regions 1a and 1b for isolating the electrical connection between the memory cells is provided between the adjacent blocks.

Referring to FIG. 2, bit line number on the right side (drain side, for example) is "m" and a bit line number on the left side (source side, for example) is "m-1" out of the two bit lines adjacent to the memory cell having an address "m".

The programming action for the selected memory cell [k, m] is performed by applying the program row voltage $V_{WP}$ to the word line $WL_k$ connected to the gate of the selected memory cell [k, m], grounding the bit line $BL_{m-1}$ connected to the source thereof and applying the program column voltage $V_{BP}$ to the bit line $BL_m$ connected to the drain thereof. The program row voltage $V_{WP}$ is a high voltage such as 9 to 12V in general and the program column voltage $V_{BP}$ is 4 to 6V to generate hot carriers in the selected memory cell [k, m] sufficiently. In addition, at this time, the program column voltage $V_{BP}$ is applied to all the bit lines on the drain side of the selected memory cell [k, m], that is, to the bit lines $BL_m$ to $BL_n$, and all the bit line on the source side of the selected memory cell [k, m], that is, the bit lines $BL_0$ to $BL_{m-1}$ are grounded. Thus, a voltage difference between the drain and source of the unselected memory cell other than the selected memory cell is prevented from being generated in the memory cell array having the virtual ground line type array constitution, whereby undesired parasitic programming (referred to as the program disturb hereinafter) is prevented from being generated in the unselected memory cell. Thus, the programming action is implemented for the selected memory cell [k, m].

Furthermore, the nonvolatile memory having the virtual ground line type memory cell array constitution includes a nonvolatile memory having a memory cell array not provided with a floating gate, as another conventional example (refer to patent document 4, for example). Here, FIG. 7 is a sectional view showing the nonvolatile memory viewed from the direction perpendicular to the bit line, in which a silicon nitride film layer 4b is used instead of the floating gate 5 in the example of the nonvolatile memory shown in FIG. 3, to retain an electric charge.

Patent document 1: Japanese Unexamined Patent Publication No. 2003-187584
Patent document 2: Japanese Unexamined Patent Publication No. 04-230079
Patent document 3: Japanese Unexamined Patent Publication No. 03-176895
Patent document 4: Japanese Unexamined Patent Publication No. 2000-514946
Non-patent document 1: S. Mukherjee et al., "A Single Transistor EEPROM Cell and implementation in 512 k CMOS EEPROM", IEDM Technical Digest, pp 616, (1985)

DISCLOSURE OF THE INVENTION

Problems to be Solved by the Invention

However, the inventor of this application has confirmed that in the nonvolatile memory having the virtual ground line type memory cell array constitution, for example in the memory cell shown in FIG. 3, when the dimension of the interval part A of the floating gates is considerably miniaturized, the phenomenon in which an electric charge is injected in the floating gate of the unselected memory cell adjacent to the selected memory cell causing erroneous programming (program disturb phenomenon) cannot be ignored.

First, in order to examine a problem after further miniaturized, the inventor of this application has compared programming characteristics of samples produced such that some parameters are set to extremely small values, and then evaluated the phenomenon precisely. That is, the dimension of the interval part A between the floating gates 4 and 5, and the dimension of the overlapped part of the floating gates 4 and 5 of the memory cell and the diffusion region 6b in FIG. 3 are set to sufficiently small values as compared with the present standard dimensions, to assume the miniaturized state. On this sample, the programming action for the selected memory cell 2 of FIG. 3 was performed according to the same process as the above-described programming action (that is, the diffusion region 6a and the diffusion region 6b are grounded and the program voltage $V_{BP}$ is applied to the diffusion region 6c and the diffusion region 6d). Here, FIG. 8 is a characteristic graph showing the change of the threshold value of the memory cell with respect to a pulse time at the time of programming action regarding the selected memory cell 2 and the adjacent unselected memory cell 3 connected to the same word line as the selected memory cell 2 and sharing the bit line diffusion region 6b serving as the drain of the selected memory cell 2 at the time of programming. It has been confirmed that the threshold voltage of a programming time characteristic curve 11 of the unselected memory cell 3 is increased after a delay of several digits (two or more digits) in a logarithmic time as compared with a program time characteristic curve 10 of the selected memory cell 2. When an isolation width 12 between the two curves is not sufficiently provided in terms of time, the disturb phenomenon is generated such that the threshold voltage of the unselected memory cell is varied while the programming action is performed on the selected memory cell in the memory cell array.

In addition, FIG. 9 shows column address dependency of a threshold voltage changed amount of the memory cell on the selected word line at the time of programming action. Here, the horizontal axis designates a column address (bit line number) and the vertical axis designates the amount of the memory cell threshold voltage change for a predetermined programming time. More specifically, a changed amount 13 of the threshold voltage of the selected memory cell having a column address 7 is confirmed and a changed amount 14 of the threshold voltage of the adjacent unselected memory cell having a column address 8 adjacent to the selected memory cell on the drain side is also confirmed from FIG. 9. Meanwhile, it is confirmed that the change amount of the threshold voltage of the memory cells having the column addresses 9 to 15 higher than the column address 8 are zero although the same program column voltage $V_{BP}$ as that applied to the bit line connected to the memory cells having the addresses 7 and 8 is applied to the connected bit lines. Consequently, it can be defined that this phenomenon is generated only in the adjacent unselected memory cell that shares the same word line and shares the bit line diffusion region serving as the program drain with the selected memory cell 2.

In addition, this phenomenon cannot be explained by a phenomenon caused by the voltage difference between the two bit lines connected to the adjacent unselected memory cell. A description will be made in detail hereinafter.

FIG. 5 shows the change amount of the threshold voltage in the case where the voltage value between the drain and source of a single memory cell not having the memory cell array structure is changed. More specifically, the change amount of the threshold voltage with respect to the drain-source voltage was measured when the drain voltage of the memory cell was set to 4.9V and the source voltage was changed from 0V to 4.9V. In addition, the threshold voltage of the memory cell to each source voltage before a stress is applied is made uniform. Referring to FIG. 5, a changed amount 15 of the threshold voltage of the memory cell is 6.5V when the drain-source voltage is 4.9V, which shows the change amount of the threshold voltage in the program characteristics of the normal selected memory cell. Here, referring to FIG. 8, the characteristic curve 11 of the change amount of the threshold voltage of the adjacent unselected memory cell is 0.5V when the characteristic curve 10 of the change amount of the threshold voltage of the selected memory cell is 6.5V. Therefore, referring to FIG. 5, it is found that the drain-source voltage required to implement the changed amount 0.5V of the threshold voltage is 2.5 V or more as can be seen from the voltage value shown by a reference 16 in FIG. 5.

Here, when it is assumed that the above-described disturb phenomenon of the adjacent unselected memory cell is caused by the voltage difference between the two bit lines connected to the adjacent unselected memory cell, since the equivalent voltage of 4.9V is applied to the bit lines on both sides of the unselected memory cell 3 shown in FIG. 2, it means that a voltage drops by 2.5V due to the program current flowing in the selected bit line 2 and a wiring resistance at the time of programming. In other words, at the time of programming action of the selected memory cell [k, m] in FIG. 2, the bit line $BL_{m-1}$ serving as the source of the selected memory cell [k, m] is grounded, the bit line $BL_{m+1}$ of the adjacent unselected memory cell [k, m+1] on the drain side is at the program column voltage $V_{BP}$ 4.9V, the potential of the bit line $BL_m$ serving as the drain of the selected memory cell [k, m] needs to be present between the ground voltage 0V and the program column voltage $V_{BP}$ 4.9V in this case. However, the voltage 4.9V between the bit line $BL_{m-1}$ and the bit line $BL_m$ required to ensure the changed amount 6.5V of the threshold voltage after the programming of the selected memory cell [k, m] shown by a reference 15 in FIG. 5, and the voltage 2.5V between the bit line $BL_m$ and the bit line $BL_{m+1}$ required to explain the threshold value changed amount 0.5V at the adjacent unselected memory cell [k, m+1] cannot be generated at the same time. Because since the voltage between the bit line $BL_{m-1}$ and the bit line $BL_{m+1}$ is 4.9V as described above, the voltage between the bit line $BL_{m-1}$ and the bit line $BL_m$ and the voltage between the bit line $BL_m$ and the bit line $BL_{m+1}$ cannot exceed the voltage 4.9V. Thus, the voltage difference of 2.5V (about 50%) is not generated between the two bit lines connected to the adjacent unselected memory cell [k, m+1] during the programming action. That is, it means that the disturb phenomenon cannot be caused by the voltage difference between the bit lines in the range of the voltage difference between the bit lines that can be generated in the normal programming action.

Consequently, it has been confirmed that the disturb phenomenon generated in the adjacent unselected memory cell [k, m+1] that shares the same word line $WL_k$ with the selected memory cell [k, m] and also shares the bit line diffusion region serving as the program drain therewith cannot be explained by the phenomenon caused by the voltage difference between the two bit line $BL_m$ and bit line $BL_{m+1}$ of the adjacent unselected memory cell [k, m+1].

Furthermore, the inventor of this application has found that dependency of the disturb phenomenon on the dimension of the interval part A between the floating gates 4 and 5 in FIG. 3. The result is shown in FIG. 6. The horizontal axis designates the dimension of the interval part A between the floating gates 4 and 5, and the vertical axis designates the change amount of the threshold voltage of the memory cell for a predetermined programming time. It can be confirmed that although the changed amount shown by a curve 17 of the threshold voltage of the selected memory cell after programmed is constant with respect to the dimension variation of the floating gate interval A, the changed amount shown by a curve 18 of the threshold voltage of the adjacent unselected memory cell is increased as the floating gate interval A is reduced.

Although it has been described that the program disturb phenomenon is generated in the nonvolatile memory cell having the floating gate as the electric charge retention part as shown in FIG. 3, the phenomenon in which a carrier is injected into the adjacent unselected memory cell adjacent to the selected memory cell and retained information is disturbed is generated similarly in a nonvolatile memory not having a floating gate and including the silicon nitride film 4b as the electric charge retention part as shown in FIG. 7.

As described above, the disturb phenomenon characterized in that it is generated only in the adjacent unselected memory cell sharing the same word line with the selected memory cell and sharing the bit line diffusion region serving as the program drain therewith, characterized in that it cannot be explained by the phenomenon caused by the voltage difference between the two bit lines of the adjacent unselected memory cell, and characterized in that it considerably depends on the interval dimension between the floating gates (or electric charge retention parts) will become a serious problem as the nonvolatile memory having the virtual ground bit line is miniaturized.

The present invention was made in view of the above problems and it is an object of the present invention to provide a nonvolatile semiconductor memory device capable of preventing the disturb phenomenon that could become a serious problem as the nonvolatile memory having the virtual ground line type memory cell array constitution is miniaturized.

Means for Solving the Problem

A semiconductor memory device according to the present invention to attain the above object comprises a memory cell array having nonvolatile memory cells each including a first electrode, a pair of second electrodes, and an electric charge retention part capable of accumulating and retaining an electric charge, in which stored contents can be read according to a conductive state between the second electrodes that changes depending on the potential of the first electrode and the electric charge amount of the electric charge retention part, and arranged in a row direction and a column direction in the form of a matrix, wherein the first electrodes of the memory cells on the same row are connected to a common word line, one of the second electrodes is connected together between the two adjacent memory cells in the row direction, one of the second electrodes of each of the memory cells on the same column is connected to a common first bit line, the other of the second electrodes of each of the memory cells on the same column is connected to a common second bit line, and the first bit line and the second bit line are alternately arranged, and it is characterized as first characteristics by further comprising a program row voltage application circuit for selecting a word line connected to a selected memory cell to be programmed in the memory cells and applying a predetermined program row voltage to the selected word line at the time of programming in the selected memory cell, a program column voltage application circuit for selecting a pair of the first bit line and the second bit line connected to the selected memory cell and applying a ground voltage to one of the pair of selected bit lines and applying a predetermined program column voltage to the other of the pair of selected bit lines at the time of programming, and a counter voltage application circuit for applying a counter voltage of an intermediate voltage between the ground voltage and the program column voltage, to an adjacent unselected bit line of the first bit lines and second bit lines, the adjacent unselected bit line not connected to the selected memory cell and adjacent to the selected bit line to which the program column voltage is applied.

The nonvolatile semiconductor memory device according to the present invention having the above characteristics is characterized as second characteristics in that the counter voltage application circuit applies the counter voltage to a part or all of the unselected bit lines positioned on the opposite side of the adjacent unselected bit line from the pair of selected bit lines, in addition to the adjacent unselected bit line at the time of programming.

The nonvolatile semiconductor memory device according to the present invention having the any of above characteristics is characterized as third characteristics in that programming to the selected memory cell is performed by applying a plurality of different voltages to the adjacent unselected bit line, and the counter voltage is set to a voltage to be applied to the adjacent unselected bit line or its vicinity value when the change width of the threshold voltage of an adjacent unselected memory cell is minimum, the threshold voltage changing based on the electric charge amount injected to the charge retention part of the adjacent unselected memory cell connected to the adjacent unselected bit line and adjacent to the selected memory cell in the row direction.

The nonvolatile semiconductor memory device according to the present invention having the above first or second characteristics is characterized as fourth characteristics in that the counter voltage is set within a range of 45% to 70% of the program column voltage.

The nonvolatile semiconductor memory device according to the present invention having any one of the above characteristics is characterized as fifth characteristics in that the electric charge retention part of the selected memory cell is adjacent to the electric charge retention part of the adjacent unselected memory cell connected to the adjacent unselected bit line and adjacent to the selected memory cell in the row direction across the second electrode connected to the selected bit line to which the program column voltage is applied.

The nonvolatile semiconductor memory device according to the present invention having any one of the above characteristics is characterized as sixth characteristics in that the interval between the electric charge retention parts of the two adjacent memory cells in the row direction is short enough for the threshold voltage of the other of the two adjacent memory cells to change in the same direction as the threshold voltage of one of the two adjacent memory cells, when the counter voltage is set to the same voltage as the program column voltage and programming is performed in the one memory cell.

The nonvolatile semiconductor memory device according to the present invention having any one the above characteristics is characterized as seventh characteristics in that the second electrode is formed in at least two layers of impurity diffusion regions having different impurity concentrations.

The nonvolatile semiconductor memory device according to the present invention having any one the above characteristics is characterized as eighth characteristics in that the second electrode is formed in the impurity diffusion region and the impurity concentration of a part of the second electrode overlapped with the first electrode is not more than $1 \times 10^{20}$ cm$^{-3}$.

The nonvolatile semiconductor memory device according to the present invention having any one the above characteristics is characterized as ninth characteristics in that the pair of second electrodes is formed in the impurity diffusion region, the memory cell has a MOSFET structure in which the first electrode is a gate electrode and the pair of second electrodes are a source and a drain, and the interval between the electric charge retention parts of the two adjacent memory cells in the row direction is shorter than an effective channel length between the source and the drain of the memory cell.

The nonvolatile semiconductor memory device according to the present invention having any one the above characteristics is characterized as tenth characteristics in that the pair of second electrodes is formed in the impurity diffusion region, the memory cell has a MOSFET structure in which the first electrode is a gate electrode and the pair of second electrodes are a source and a drain, and the electric charge retention part is a floating gate positioned under the first electrode and insulated from the first electrode and the pair of second electrodes through an insulation film.

The nonvolatile semiconductor memory device according to the present invention having any one the first to ninth characteristics is characterized as eleventh characteristics in that the pair of second electrodes is formed in the impurity diffusion region, the memory cell has a MOSFET structure in which the first electrode is a gate electrode and the pair of second electrodes are a source and a drain, and the electric charge retention part is formed of an insulation film having an electric charge trap function sandwiched between a first insulation film and a second insulation film.

EFFECT OF THE INVENTION

The nonvolatile semiconductor memory device having the first characteristics includes the program row voltage application circuit for applying the predetermined program row voltage to the selected word line at the time of programming in the selected memory cell, the program column voltage application circuit for applying the ground voltage to one of the pair of selected bit lines and applying the predetermined program column voltage to the other thereof at the time of programming, and the counter voltage application circuit for applying the counter voltage of the intermediate voltage between the ground voltage and the program column voltage to the adjacent unselected bit line adjacent to the selected bit line on the side to which the program column voltage is applied, so that the counter voltage can be applied to the bit line connected to the adjacent unselected memory cell and the disturb phenomenon having the following characteristics and expected to become a serious problem, as the nonvolatile memory having the virtual ground bit line is miniaturized, can be suppressed to the minimum at the time of the programming action in the virtual ground line type memory cell array. That is, the disturb phenomenon is characterized in that it is generated only in the adjacent unselected memory cell sharing the same word line with the selected memory cell and sharing the bit line diffusion region serving as the program drain therewith, characterized in that it cannot be explained by the phenomenon caused by the voltage difference between the two bit lines in the adjacent unselected memory cell, and characterized in that it considerably depends on the interval dimension between the floating gates (or electric charge retention parts).

Furthermore, when the counter voltage is also applied to a part or all of the unselected bit lines, the disturb phenomenon of the memory cells positioned on the opposite side of the adjacent unselected bit line from the pair of selected bit can be prevented.

In addition, when the counter voltage is set within a range of about 45% to 70% of the program column voltage, it can be suppressed to the minimum.

EXPLANATION OF REFERENCES

1: WORD LINE
2: MEMORY CELL
3: MEMORY CELL
4: FLOATING GATE
5: FLOATING GATE
6: DIFFUSION REGION
6A: DIFFUSION REGION
6B: DIFFUSION REGION
6C: DIFFUSION REGION
6D: DIFFUSION REGION
7: SEMICONDUCTOR SUBSTRATE
8: TUNNEL INSULATION FILM
9: INSULATION FILM
100: NONVOLATILE SEMICONDUCTOR MEMORY DEVICE ACCORDING TO THE PRESENT INVENTION
101: MEMORY CELL ARRAY
102: ROW DECODER
103: COLUMN DECODER
104: PROGRAM ROW VOLTAGE APPLICATION CIRCUIT
105: PROGRAM COLUMN VOLTAGE APPLICATION CIRCUIT
106: COUNTER VOLTAGE APPLICATION CIRCUIT

BEST MODE FOR CARRYING OUT THE INVENTION

Embodiments of a nonvolatile semiconductor memory device according to the present invention (referred to as "device of the present invention" occasionally hereinafter) will be described with reference to the drawings hereinafter.

Figure 1:
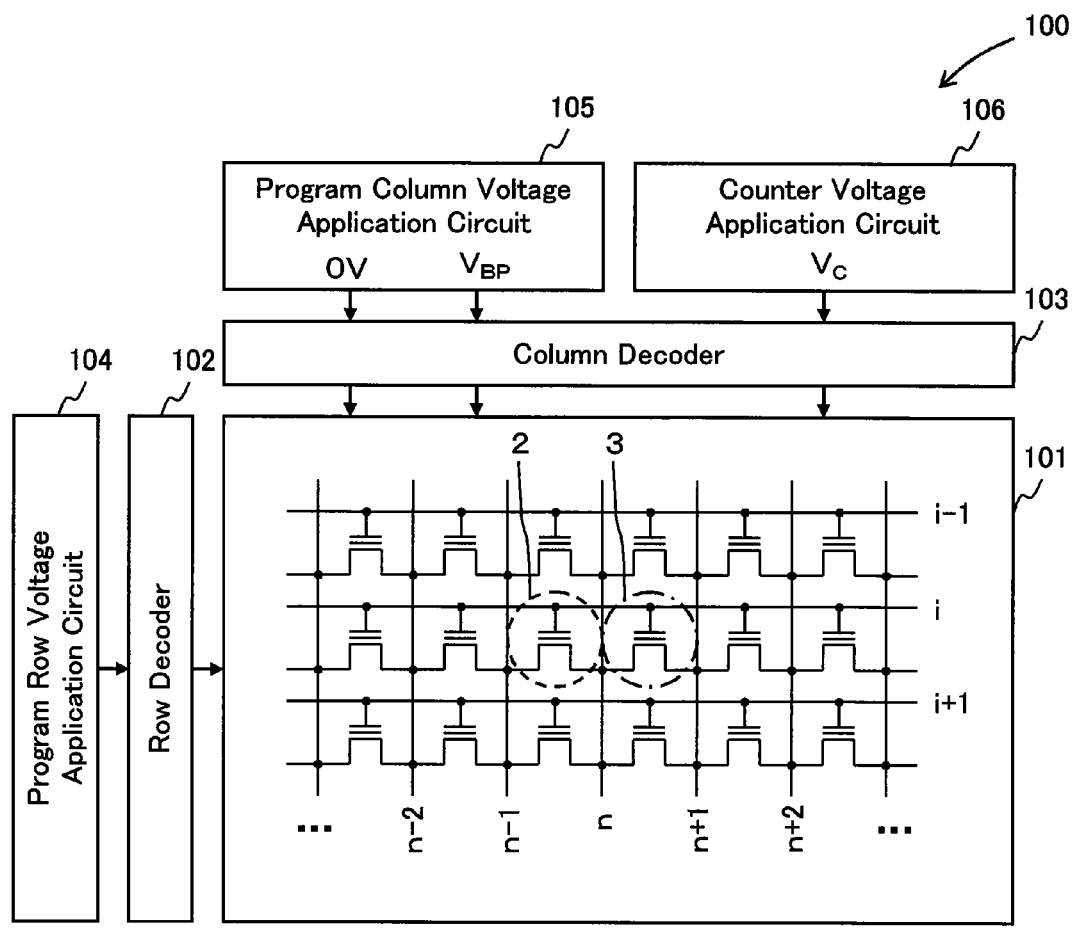
FIG. 1 is a schematic block diagram showing the schematic constitution of a nonvolatile semiconductor memory device according to the present invention.

FIG. 1 is a block diagram showing the schematic constitution of the device of the present invention. According to this embodiment, a flash memory cell having a MOSFET structure containing a floating gate is assumed as a memory cell constituting a memory cell array 101. According to the flash memory cell, an electron amount accumulated in the floating gate through well-known programming and erasing actions is controlled and the threshold voltage of the memory cell is changed, to determine its stored state. As shown in FIG. 1, a device 100 of the present invention includes the memory cell array 101, a row decoder 102, a column decoder 103, a program row voltage application circuit 104, a program column voltage application circuit 105, and a counter voltage application circuit 106.

Figure 2:
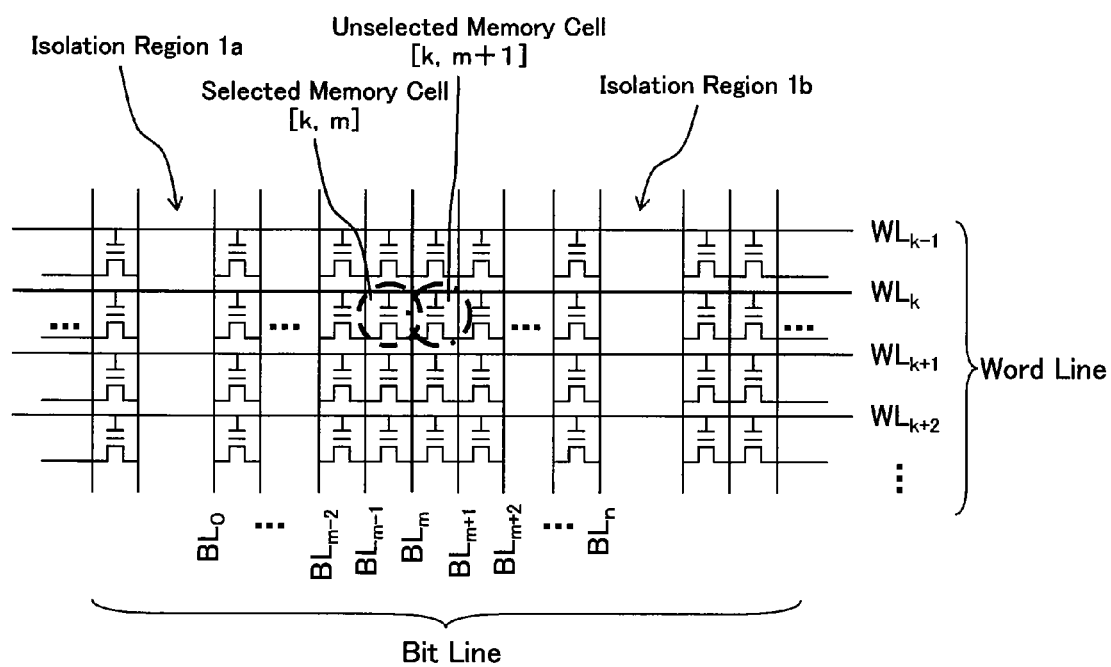
FIG. 2 is a schematic plan view showing the schematic constitution of a memory cell array of the nonvolatile semiconductor memory device.
Figure 3:
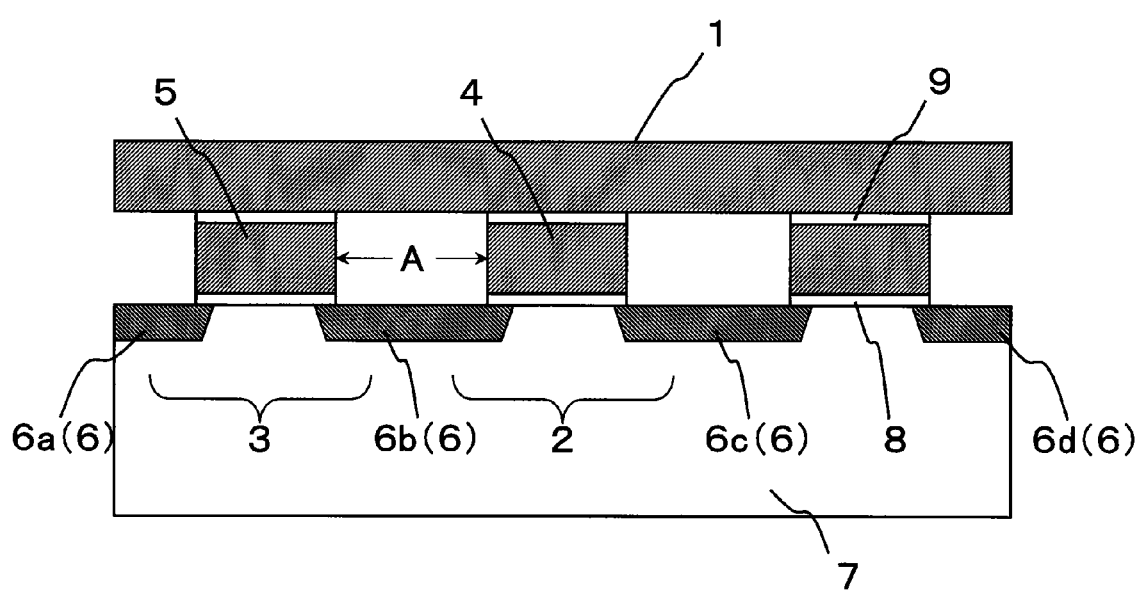
FIG. 3 is a schematic sectional view showing the basic constitution of a memory cell of the nonvolatile semiconductor memory device.

The memory cell array 101 has the same constitution as that in the conventional art, and as shown in FIGS. 1 to 3, includes nonvolatile memory cells each having a control gate, a source, a drain, and a floating gate serving as an electric charge retention part capable of accumulating and retaining an electric charge injected from the source and the drain, in which stored contents can be read according to the on/off state between the source and the drain that is changed based on the potential of the control gate and the electric charge amount of the floating gate, and the memory cells are arranged in row and column direction in the form of a matrix. Furthermore, control gates of the memory cells belonging to the same row are connected to a common word line $WL_i$, one electrode is connected together between the two memory cells adjacent in the row direction, sources of the memory cells on the same column are connected to a common bit line $BL_{j-1}$, drains of the memory cells on the same column are connected to a common bit line $BL_j$, and the bit line $BL_{j-1}$ and the bit line $BL_j$ (corresponding to a first bit line and a second bit line, respectively) are alternately arranged. A pair of bit lines connected to the source and the drain of a selected memory cell to be read is referred to as "selected bit line" and the bit lines other than the pair of selected bit line are referred to as "unselected bit line" to simplify the description hereinafter.

The memory cell according to this embodiment has the same constitution as that of the memory cell according to the conventional art, such that as shown in FIG. 3, the memory cells 2 and 3 including the tunnel insulation film 8, the floating gates 4 and 5, and the insulation film 9 are formed on the first conductivity type semiconductor substrate 7. The diffusion region 6 is provided in a self-aligned manner on the semiconductor substrate 7 below an interval part A between the floating gate 4 of the memory cell 2 and the floating gate 5 of the memory cell 3 and serves as the bit line connected to the drain and the source of the memory cell. Furthermore, according to this embodiment, the distance between the floating gates of the two adjacent memory cells in the row direction is short enough for the threshold voltage of the other memory cell to change in the same direction as the threshold voltage of one memory cell when a counter voltage $V_C$ is set at the same voltage as a program column voltage $V_{BP}$ and programming is performed for one memory cell. Consequently, it is assumed that program disturb is generated in the adjacent unselected memory cell, according to the conventional method for applying the program voltage.

As shown in FIGS. 1 and 2, the program row voltage application circuit 104 applies a predetermined program row voltage to the word line $WL_k$ selected by the row decoder 102 at the time of programming to the selected memory cell [k, m] to be programmed in the memory cell.

As shown in FIGS. 1 and 2, the program column voltage application circuit 105 applies the ground voltage 0V to one of the pair of selected bit lines $BL_{m-1}$ and $BL_m$ selected by the column decoder 103 and applies the program column voltage $V_{BP}$ to the other of the pair of selected bit lines $BL_{m-1}$ and $BL_m$ at the time of programming to the selected memory cell [k, m] to be programmed in the memory cell. According to this embodiment (shown in FIG. 2), the ground voltage 0V is applied to the bit line $BL_{m-1}$ and the program column voltage $V_{BP}$ is applied to the bit line $BL_m$.

Furthermore, as shown in FIGS. 1 and 2, the counter voltage application circuit 106 applies the counter voltage $V_C$ that is an intermediate voltage between the ground voltage 0V and the program column voltage $V_{BP}$, to the adjacent unselected bit line adjacent to the selected bit line to which the program column voltage $V_{BP}$ is applied, at the time of programming. In addition, the counter voltage application circuit 106 according to this embodiment applies the counter voltage $V_C$ to all the unselected bit lines positioned on the opposite side of the adjacent unselected bit line $BL_{m+1}$ from the pair of selected bit lines in the same block, as well as the adjacent unselected bit line $BL_{m+1}$, at the time of programming. Therefore, according to this embodiment, the ground voltage, the program column voltage $V_{BP}$, or the counter voltage $V_C$ is applied to all the bit lines in the same block containing the selected memory cell to be programmed through the column decoder 103. More specifically, the ground voltage and the program column voltage $V_{BP}$ are applied to the pair of selected bit lines, and either the ground voltage or the counter voltage $V_C$ is applied to the unselected bit lines.

Next, a method for determining the counter voltage $V_C$ will be described. As shown in FIGS. 1 and 2, in the memory cell array including the word lines $WL_i$ (i=0, ..., k, k+1, ...) connected to the row decoder and the bit lines $BL_j$ (j=0, ..., m, ..., n) connected to the column decoder, the programming action for the selected memory cell [k, m] is performed by applying a program row voltage $V_{WP}$ to the word line $WL_k$ connected to the gate of the selected memory cell [k, m], grounding the bit line $BL_{m-1}$ connected to the source thereof and applying the program column voltage $V_{BP}$ to the bit line $BL_m$ connected to the drain thereof. The program row voltage $V_{WP}$ is a high voltage such as 9 to 12V in general and the program column voltage $V_{BP}$ is 4 to 6V to generate hot carriers in the selected memory cell [k, m] sufficiently. According to the device 100 of the present invention, at this time, the counter voltage $V_C$ is applied to the bit lines $BL_{m+1}$, $BL_{m+2}$, ..., $BL_n$ starting from the bit line $BL_{m+1}$ that is adjacent to the bit line $BL_m$ connected to the drain of the selected memory cell [k, m]. Here, as shown in FIG. 2, the bit line $BL_n$ is the last bit line of repetition in which the bit line and the active region of the transistor are sequentially and alternately repeated.

Here, according to this embodiment, the counter voltage $V_C$ is changed between the program column voltage $V_{BP}$ and the ground voltage, or within a certain range of them, the change amount of the threshold voltage of the adjacent unselected memory cell [k, m+1] for a certain period at that time is measured, and the value in the vicinity of the minimum value of the change amount of the threshold voltage is set as the counter voltage $V_C$. In addition, the counter voltage $V_C$ may be determined by setting a value that has been calculated previously on an experimental basis, or finding the characteristics of the memory cell with respect to each chip and setting an optimal value with respect to each chip.

Figure 4:
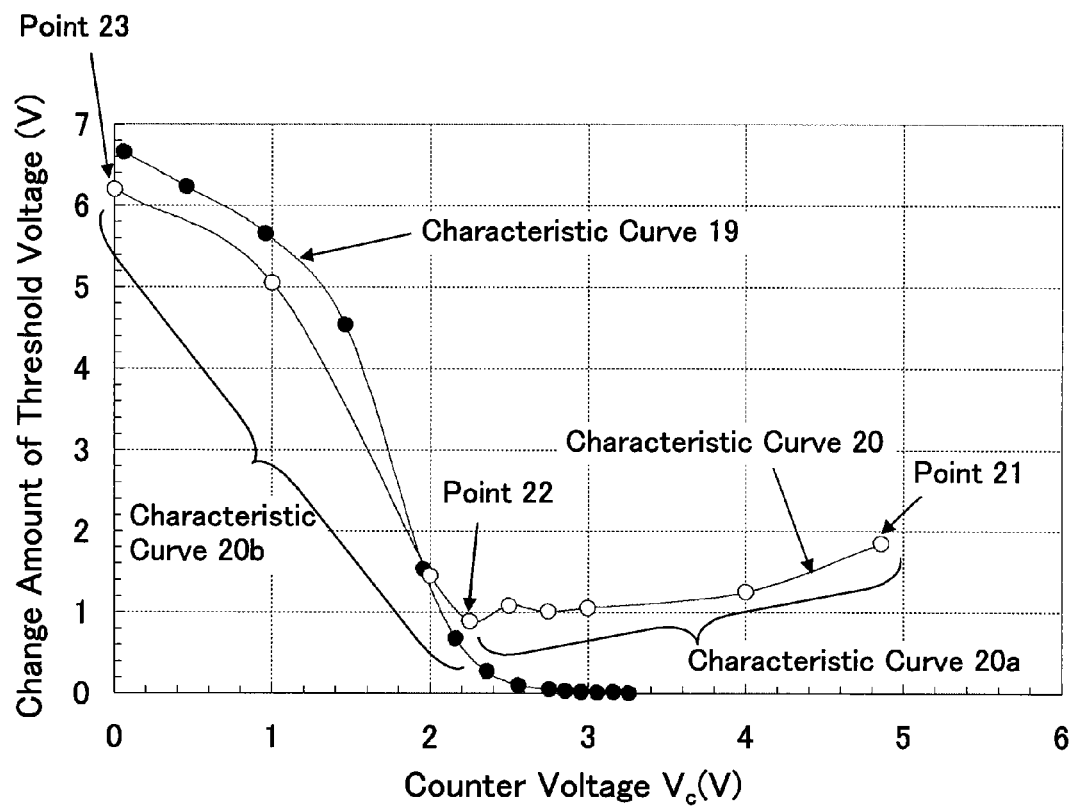
FIG. 4 is a graph showing the relation between counter voltage $V_c$ and the change amount of the threshold voltage of the memory cell of the nonvolatile semiconductor memory device according to the present invention.

Next, one example of the method for setting the counter voltage $V_C$ will be described in detail with reference to FIG. 4. FIG. 4 shows the change amount of the threshold voltage of the adjacent unselected memory cell [k, m+1] adjacent to the selected memory cell [k, m] on the drain side, with respect to the value of the counter voltage $V_C$ applied to the bit line $BL_{m+1}$. Here, according to this embodiment, in order to make the disturb phenomenon conspicuous, the dimension of the interval part A between the floating gates 4 and 5 is set to 130 nm, the overlap dimension of the floating gates 4 and 5 of the memory cell with the diffusion region 6b is set to be less than 50 nm in FIG. 3. The characteristics in this case are shown by a characteristic curve 20. In addition, for comparison, the relation between the drain-source voltage in the single memory cell and the change amount of the threshold voltage shown in FIG. 5 is shown by a characteristic curve 19.

Referring to FIG. 4, a right end point 21 of the characteristic curve 20 is the change amount of the threshold voltage when the same voltage as that applied to the selected bit line $BL_m$ is applied to the unselected bit line $BL_{m+1}$, which is the same as the change amount of the threshold voltage due to the disturb phenomenon in the conventional example. As the voltage (counter voltage $V_C$) of the unselected bit line $BL_{m+1}$ is gradually decreased, the change amount of the threshold voltage is decreased and increased again from a point 22 that is about 45% of the voltage (program column voltage $V_{BP}$) of the selected bit line $BL_m$ as a minimum value (smallest value). In the process of the characteristics curve 20b from the minimum value point 22 to a point 23 in which the counter voltage is 0V, the change amount of the threshold voltage is increased.

Figure 5:
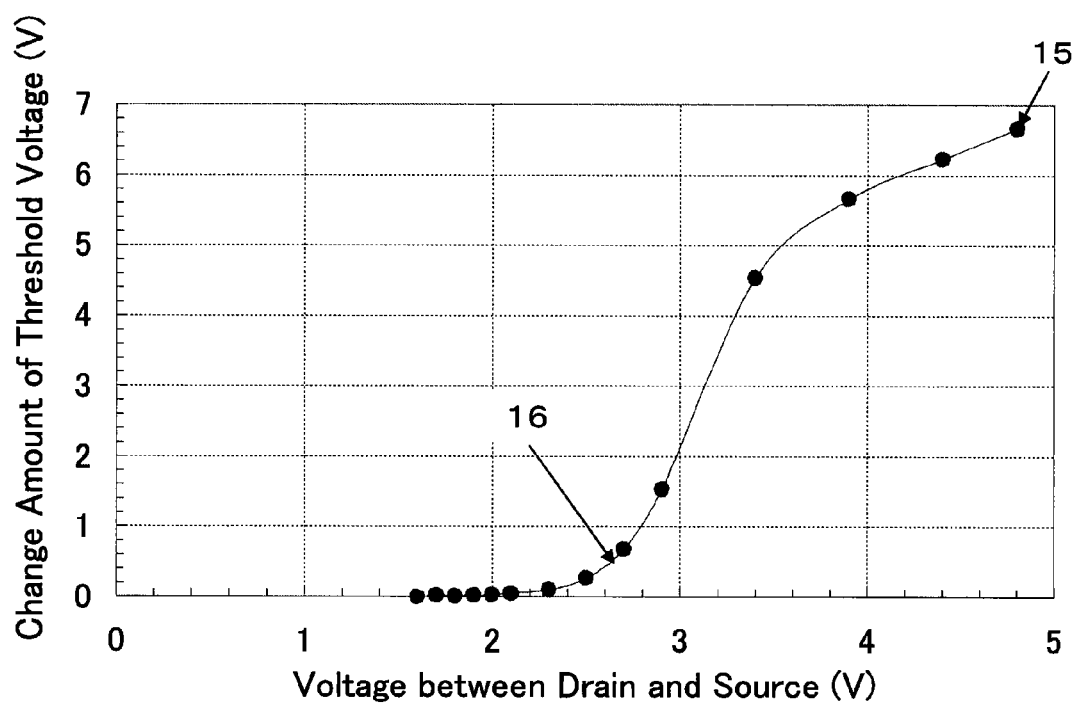
FIG. 5 is a graph showing the relation between a drain-source voltage and the change amount of the threshold voltage of the single memory cell.
Figure 6:
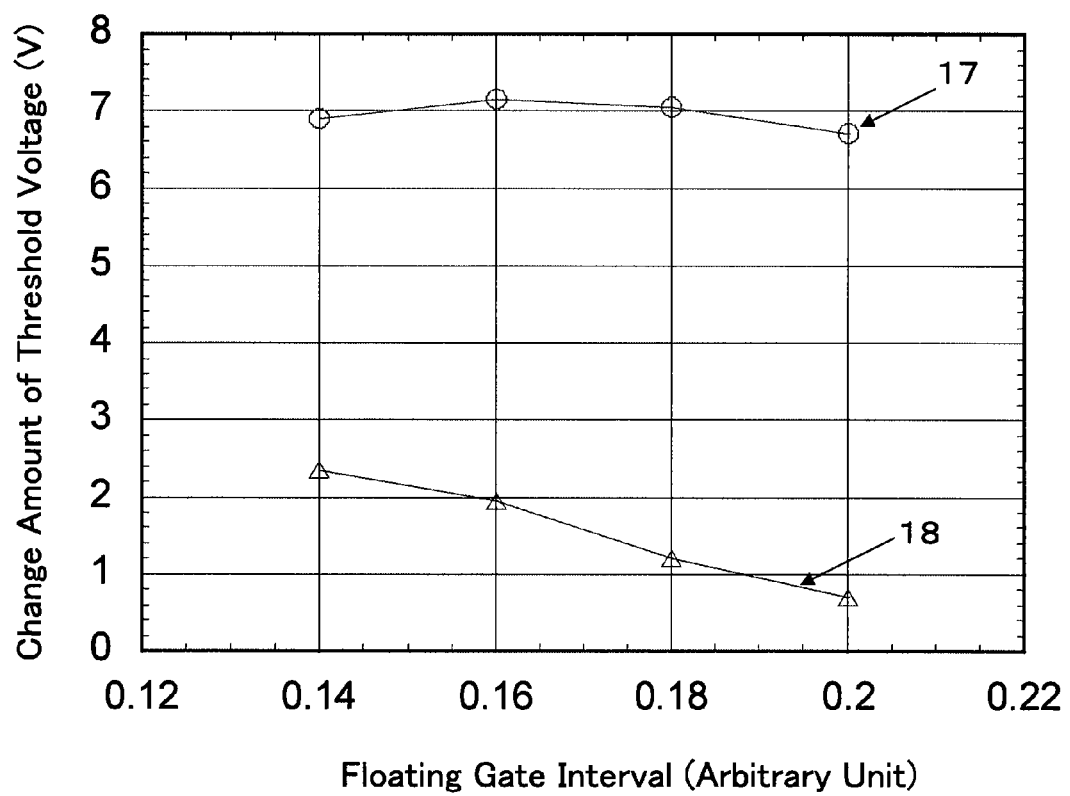
FIG. 6 is a graph showing the relation between the floating gate interval of the adjacent memory cells and the change amount of the threshold voltage thereof.

The process of the characteristic curve 20b almost coincides with the characteristic curve 19 of the programming effect depending on the voltage between the pair of bit lines shown in FIG. 5. In addition, since the change in the threshold voltage of the memory cell according to the characteristic curve 19 is considerably smaller than the change amount of the threshold voltage due to the disturb phenomenon designated by the characteristic curve 20a in a range where the counter voltage $V_C$ is higher than the minimum value point 22, the change amount of the threshold value designated by the characteristic curve 20a dominates the change in the threshold voltage of the memory cell in this range. Therefore, when the counter voltage $V_C$ is set from the point 21 to the point 22 in the characteristic curve 20a, the carrier injection to the unselected memory cell can be prevented according to the decrease in the change amount of the threshold voltage, that is, the disturb phenomenon can be prevented.

More specifically, since the vertical axis in FIG. 4 corresponds to the total number of the carriers accumulated in the floating gate of the adjacent unselected memory cell [k, m+1] for a certain period by the carrier injection, the optimal value of the counter voltage $V_C$ against the disturb phenomenon is a voltage value in which the trade-off between the characteristic curve 20a of the disturb phenomenon based on the counter voltage $V_C$ and the curve 20b according to the programming effect depending on the voltage difference between the pair of bit lines is balanced and the change amount of the threshold voltage becomes the minimum value. Referring to FIG. 4, this voltage value corresponds to about half of the program column voltage $V_{BP}$ applied to the selected bit line $BL_m$ at the time of programming. According to this embodiment, the counter voltage $V_C$ at the minimum value point 22 is about 2.3V with respect to the program column voltage $V_{BP}$ (4.9V).

In addition, as shown in FIG. 4, since the change amount of the characteristic curve 20b with respect to the horizontal axis is steeper than that of the characteristic curve 20a, it is preferably that the counter voltage $V_C$ is set to a value greater than about 45% of the program column voltage $V_{BP}$ in view of a safety margin for variation in the counter voltage $V_C$ and programming performance in the memory cell. Furthermore, as an appropriate margin range in this case, it may be set at a value less than about 70% of the program column voltage $V_{BP}$. As shown in FIG. 4, when the counter voltage $V_C$ is set within a range of about 45% to 70% of the program column voltage $V_{BP}$, the change amount of the threshold voltage due to the program disturb can be suppressed to half of the conventional example or less.

In addition, when examining the above optimal values of the various samples under various programming action conditions, the applicant has confirmed that the optimal value always exists within the range of about 45% to 70% of the drain voltage of the selected memory cell at the time of programming. Thus, although the effect of the present invention can be provided by accurately searching and setting the counter voltage $V_C$ to the optimal value with respect to each product as described in the above embodiment, a similar disturb phenomenon preventing effect can be expected by previously setting the counter voltage $V_C$ to the voltage of about 45% to 70% of the program column voltage $V_{BP}$, that is, the drain voltage of the selected memory cell at the time of programming.

In addition, since the disturb phenomenon is apparently generated when the interval A between the floating gates of the two adjacent memory cells in the row direction is shorter than an effective channel length between the source and drain of the memory cell, the disturb phenomenon caused by the change amount of the threshold voltage of the memory cell and the application of the counter voltage $V_C$ can be prevented according to the present invention.

Furthermore, since the disturb phenomenon is apparently generated in the unselected memory cell having the floating gate serving as the electric charge retention part adjacent in an extended line direction of the vector of a channel electron generated from the source to drain of the selected memory cell at the time of programming, in the plan structure of the memory array, the disturb phenomenon caused by the change amount of the threshold voltage of the memory cell and the application of the counter voltage $V_C$ can be prevented according to the present invention.

Furthermore, since the disturb phenomenon is also apparently generated when the floating gate of the selected memory cell and the floating gate of the unselected memory cell connected to the bit line to which the counter voltage $V_C$ is applied are adjacent across the bit line serving as the drain of the selected memory cell at the time of programming, the disturb phenomenon caused by the change amount of the threshold voltage of the memory cell and the application of the counter voltage $V_C$ can be prevented according to the present invention.

Furthermore, since the disturb phenomenon is also apparently generated when the impurity diffusion regions serving as the drain and source of the unselected memory cell connected to the bit line to which the counter voltage $V_C$ is applied have at least two layers of diffusion structures, the disturb phenomenon caused by the change amount of the threshold voltage of the memory cell and the application of the counter voltage $V_C$ can be prevented according to the present invention.

Still furthermore, since the disturb phenomenon is also apparently generated when the source electrode or the drain electrode is formed as at least two layers of impurity diffusion regions having different impurity concentrations, and in an overlapped region of the second conductivity type impurity diffusion region and the gate electrode of the unselected memory cell connected to the bit line to which the counter voltage $V_C$ is applied, the concentration of the second conductivity type impurity diffusion region is $1 \times 10^{20}$ cm$^{-3}$ or less, the disturb phenomenon caused by the change amount of the threshold voltage of the memory cell and the application of the counter voltage $V_C$ can be prevented according to the present invention.

Next, another embodiment of the device of the present invention and the method of the present invention will be described.

Figure 7:
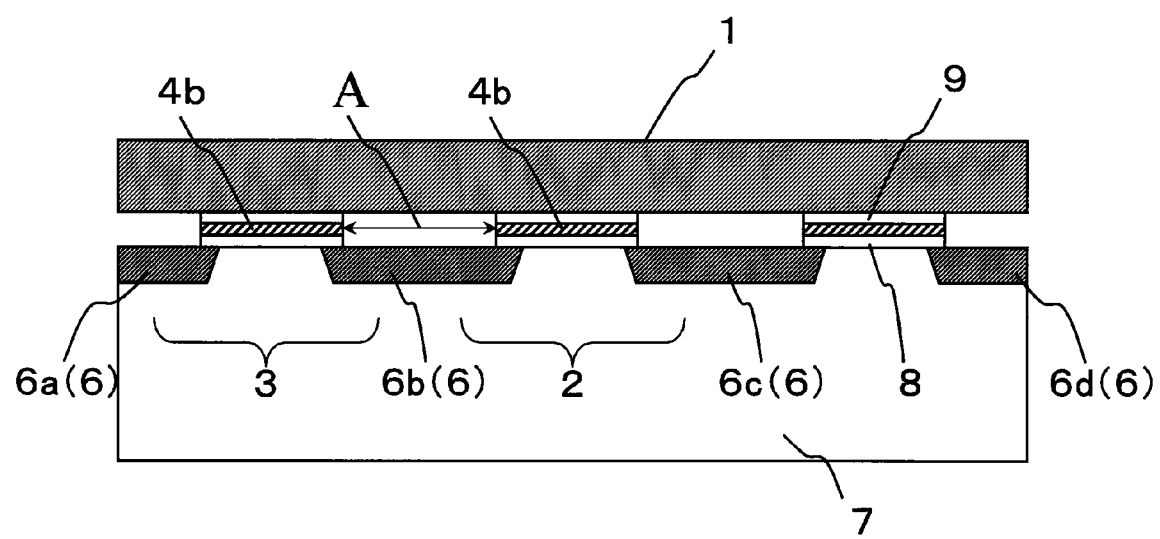
FIG. 7 is a schematic sectional view showing the basic constitution of a memory cell of the nonvolatile semiconductor memory device.
Figure 8:
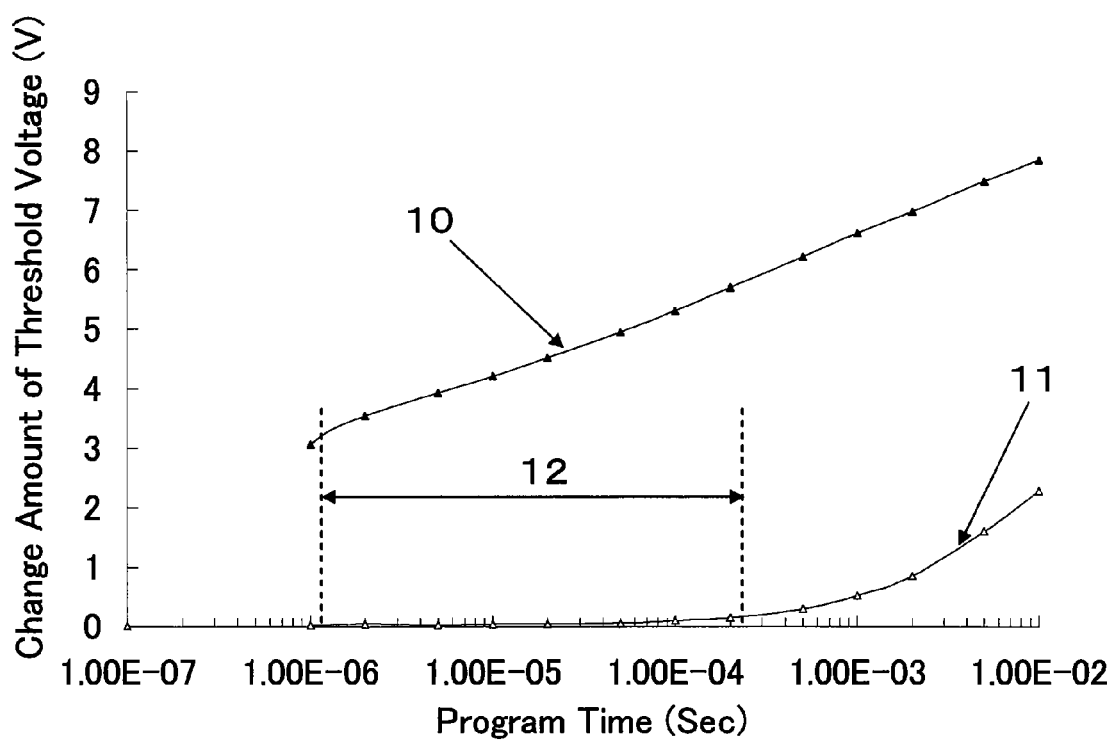
FIG. 8 is a graph showing the relation between the programming time and the change amount of the threshold voltage of a memory cell of a nonvolatile semiconductor memory device according to a conventional art.
Figure 9:
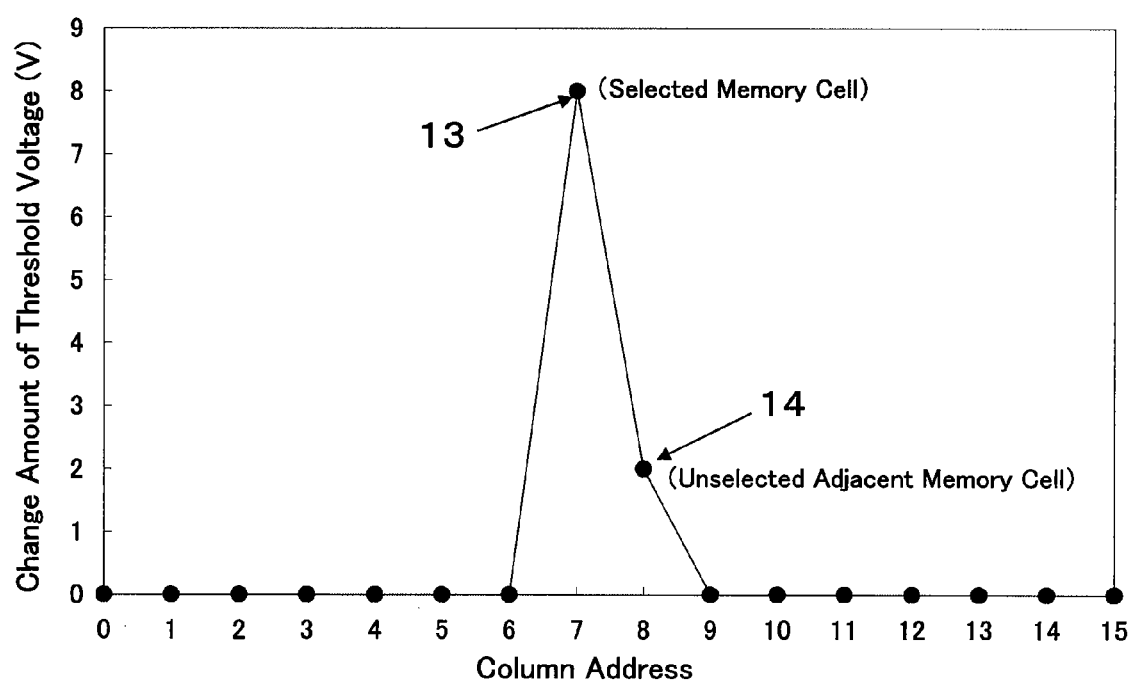
FIG. 9 is a graph showing the relation between a bit line address and the change amount of the threshold voltage in a memory cell array of the nonvolatile semiconductor memory device according to the conventional art.

(1) Although the description has been made of the nonvolatile memory having the floating gate as shown in FIG. 3 in the above embodiment, the device of the present invention may have an electric retention part formed of an insulating film $4b$ having an electric charge trap function sandwiched between two insulation films 8 and 9, instead of the floating gate as shown in FIG. 7. For example, the same effect can be provided when the present invention is applied to a nonvolatile memory using a silicon nitride film layer $4b$ as the insulation film $4b$ having the electric charge trap function to retain the electric charge.

(2) Although the description has been made of the case where the counter voltage $V_C$ is applied to all the unselected bit lines positioned on the opposite side of the adjacent unselected bit line $BL_{m+1}$ from the pair of selected bit lines in the same block, as well as the adjacent unselected bit line $BL_{m+1}$ at the time of programming in the above embodiment, the counter voltage $V_C$ may be applied to only the adjacent unselected bit line $BL_{m+1}$. In this case, in a manner similar to the conventional example, the program column voltage $V_{BP}$ may be applied to all the unselected bit lines in the same block positioned on the opposite side of the adjacent unselected bit line $BL_{m+1}$ from the pair of selected bit lines.

The invention claimed is:

1. A semiconductor memory device comprising:

a memory cell array having nonvolatile memory cells each including a first electrode, a pair of second electrodes, and an electric charge retention part capable of accumulating and retaining an electric charge, in which stored contents can be read according to a conductive state between the second electrodes that changes depending on a potential of the first electrode and an electric charge amount of the electric charge retention part, and arranged in a row direction and a column direction in a form of a matrix, wherein the first electrodes of the memory cells on the same row are connected to a common word line, one of the second electrodes is connected together between the two adjacent memory cells in the row direction, one of the second electrodes of each of the memory cells on the same column is connected to a common first bit line, the other of the second electrodes of each of the memory cells on the same column is connected to a common second bit line, and the first bit line and the second bit line are alternately arranged;

a program row voltage application circuit for selecting a word line connected to a selected memory cell to be programmed in the memory cells and applying a predetermined program row voltage to the selected word line at the time of programming in the selected memory cell;

a program column voltage application circuit for selecting a pair of the first bit line and the second bit line connected to the selected memory cell and applying a ground voltage to one of the pair of selected bit lines and applying a predetermined program column voltage to the other of the pair of selected bit lines at the time of programming; and a counter voltage application circuit for applying a counter voltage of an intermediate voltage between the ground voltage and the program column voltage, to an adjacent unselected bit line of the first bit lines and second bit lines, the adjacent unselected bit line not connected to the selected memory cell and adjacent to the selected bit line to which the program column voltage is applied.

2. The nonvolatile semiconductor memory device according to claim 1, wherein the counter voltage application circuit applies the counter voltage to a part or all of the unselected bit lines positioned on the opposite side of the adjacent unselected bit line from the pair of selected bit lines, in addition to the adjacent unselected bit line at the time of programming.

3. The nonvolatile semiconductor memory device according to claim 1, wherein programming to the selected memory cell is performed by applying a plurality of different voltages to the adjacent unselected bit line, and the counter voltage is set to a voltage to be applied to the adjacent unselected bit line or its vicinity value when a change width of a threshold voltage of an adjacent unselected memory cell is minimum, the threshold voltage changing based on an electric charge amount injected to the charge retention part of the adjacent unselected memory cell connected to the adjacent unselected bit line and adjacent to the selected memory cell in the row direction.

4. The nonvolatile semiconductor memory device according to claim 1, wherein the counter voltage is set within a range of 45% to 70% of the program column voltage.

5. The nonvolatile semiconductor memory device according to claim 1, wherein the electric charge retention part of the selected memory cell is adjacent to the electric charge retention part of the adjacent unselected memory cell connected to the adjacent unselected bit line and adjacent to the selected memory cell in the row direction across the second electrode connected to the selected bit line to which the program column voltage is applied.

6. The nonvolatile semiconductor memory device according to claim 1, wherein an interval between the electric charge retention parts of the two adjacent memory cells in the row direction is short enough for a threshold voltage of the other of the two adjacent memory cells to change in the same direction as a threshold voltage of one of the two adjacent memory cells, when the counter voltage is set to the same voltage as the program column voltage and programming is performed in the one memory cell.

7. The nonvolatile semiconductor memory device according to claim 1, wherein the second electrode is formed in at least two layers of impurity diffusion regions having different impurity concentrations.

8. The nonvolatile semiconductor memory device according to claim 1, wherein the second electrode is formed in an impurity diffusion region and an impurity concentration of a part of the second electrode overlapped with the first electrode is not more than $1 \times 10^{20}$ cm$^{-3}$.

9. The nonvolatile semiconductor memory device according to claim 1, wherein the pair of second electrodes is formed in an impurity diffusion region, the memory cell has a MOSFET structure in which the first electrode is a gate electrode and the pair of second electrodes are a source and a drain, and an interval between the electric charge retention parts of the two adjacent memory cells in the row direction is shorter than an effective channel length between the source and the drain of the memory cell.

10. The nonvolatile semiconductor memory device according to claim 1, wherein the pair of second electrodes is formed in an impurity diffusion region, the memory cell has a MOSFET structure in which the first electrode is a gate electrode and the pair of second electrodes are a source and a drain, and the electric charge retention part is a floating gate positioned under the first electrode and insulated from the first electrode and the pair of second electrodes through an insulation film.

11. The nonvolatile semiconductor memory device according to claim 1, wherein the pair of second electrodes is formed in an impurity diffusion region, the memory cell has a MOSFET structure in which the first electrode is a gate electrode and the pair of second electrodes are a source and a drain, and the electric charge retention part is formed of an insulation film having an electric charge trap function sandwiched between a first insulation film and a second insulation film.

\* \* \* \* \*